(12) United States Patent
Chien

(10) Patent No.: US 6,665,331 B2
(45) Date of Patent: Dec. 16, 2003

(54) LIGHT ADJUSTMENT DEVICE FOR OSCILLATING LASER CAVITY

(75) Inventor: Teng-Yuan Chien, Keelung (TW)

(73) Assignee: Quarton Inc. (TW)

( * ) Notice: Subject to any disclaimer, the term of this patent is extended or adjusted under 35 U.S.C. 154(b) by 198 days.

(21) Appl. No.: 10/014,372

(22) Filed: Oct. 26, 2001

(65) Prior Publication Data

US 2002/0090255 A1 Jul. 11, 2002

Related U.S. Application Data

(63) Continuation-in-part of application No. 09/759,810, filed on Jan. 11, 2001, now Pat. No. 6,485,217.

(51) Int. Cl.[7] .................................. H01S 5/22
(52) U.S. Cl. .......................... 372/109; 372/36
(58) Field of Search ................... 372/36, 109

(56) References Cited

U.S. PATENT DOCUMENTS

| | | | | |
|---|---|---|---|---|
| 4,723,257 A | * | 2/1988 | Baer et al. | 372/108 |
| 5,446,635 A | * | 8/1995 | Jehn | 362/259 |
| 5,784,823 A | * | 7/1998 | Chen | 42/103 |
| 6,315,432 B1 | * | 11/2001 | Kuo | 362/287 |

* cited by examiner

Primary Examiner—James Davie
(74) Attorney, Agent, or Firm—Raymond Sun

(57) ABSTRACT

A light adjustment device for a laser oscillating cavity has a laser base having a housing that defines a laser chamber that retains a laser diode therein, and a fixing seat disposed at one end of the housing. The light adjustment device also includes an upper cover that is removably coupled with the fixing seat to define a spherical groove, an adjuster body having a ball and an adjusting shaft, and an oscillating cavity holder adjustably retained inside a bore that extends through the ball.

17 Claims, 6 Drawing Sheets

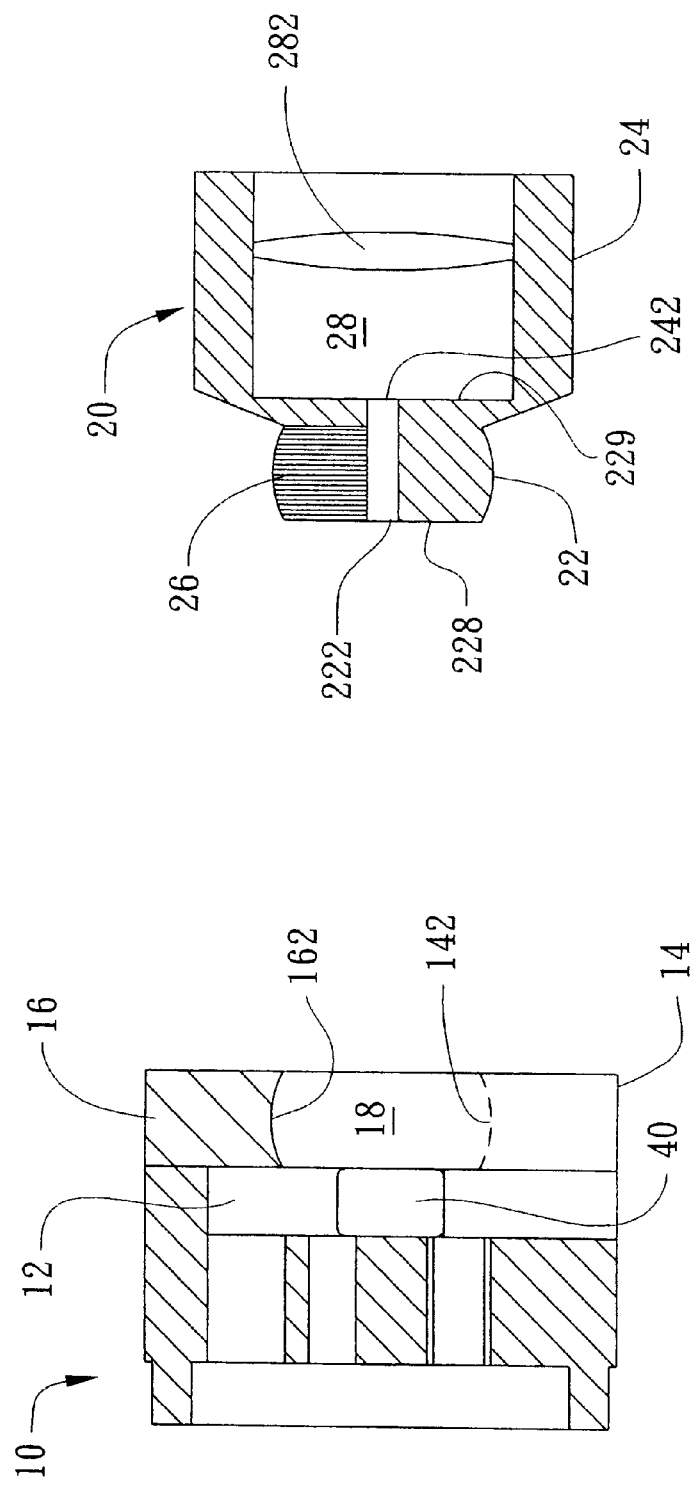

US 6,665,331 B2

LIGHT ADJUSTMENT DEVICE FOR OSCILLATING LASER CAVITY

RELATED CASES

This is a continuation-in-part of Ser. No. 09/759,810, entitled "Light Adjustment Device for Laser Resonant Socket", filed Jan. 11, 2001, now U.S. Pat. No. 6,485,217, whose disclosure is incorporated by this reference as though fully set forth herein.

BACKGROUND OF THE INVENTION

1. Field of the Invention

The present invention relates to a light adjustment device for a laser resonant socket.

2. Description of the Prior Art

Recently, the advancements of the photoelectron industry and the great improvement of semiconductor manufacturing processes have resulted in increased use of laser diode products. Since the manufacture of laser diodes at certain frequencies is rather difficult and the cost is rather high, an infrared laser diode is normally used as the solid laser of a pump light source to operate in coordination with the nonlinear function of multiple frequency crystal to generate the laser beam according to the desired frequencies. However, a micro resonant socket laser system structured by the gain media and multiple frequencies need to have its beam emission adjusted first before a preferred output power can be obtained.

The light adjustment used by the prior art is to first place a laser diode and a laser resonant socket along the same plane, and then to use a sharp object to move the laser resonant socket about so as to adjust the laser beam's projection point and angle on the light entering face of the resonant socket to obtain a better output power. After the adjustment has been completed, glue is used to fix the desired location of the laser diode and the laser resonant socket.

However, the accuracy of such an adjustment method is quite limited because the range of the adjustment is limited to horizontal rotation and movement, and cannot adjust perpendicular angles and/or utilize axial rotation. Consequently, this inability to accurately adjust the relative positions of the laser diode and the laser resonant socket means that the emitted laser beam cannot be optimized, thereby leading to a drop in the efficiency of the whole laser system. In addition, the heat yielded in the laser resonant socket during use usually leads to the uneven expansion of the elements of the resonant socket, causing laser light dot deflection. Since the entry point of the laser beam has deviated from its optimum position, the output power will drop, so that the glue used to attach the laser diode and the laser resonant socket will be compromised, possibly causing the resonant socket to become loose and to even fall off.

SUMMARY OF THE DISCLOSURE

It is an object of the present invention to provide a light adjustment device for a laser resonant socket.

It is yet another object of the present invention to provide a light adjustment device for a laser resonant socket that facilitates adjustment in all directions to obtain the highest output power.

It is yet another object of the present invention to provide a light adjustment device for a laser resonant socket that is effective in quickly conducting away the heat from the resonant socket.

The objectives of the present invention can be accomplished by providing a light adjustment device for a laser oscillating cavity. The light adjustment device has a laser base having a housing that defines a laser chamber that retains a laser diode therein, and a fixing seat disposed at one end of the housing. The light adjustment device also includes an upper cover that is removably coupled with the fixing seat to define a spherical groove, an adjuster body having a ball and an adjusting shaft, and an oscillating cavity holder adjustably retained inside a bore that extends through the ball.

BRIEF DESCRIPTION OF THE DRAWINGS

FIG. 2 is a cross-sectional view of a laser base of the light adjustment device shown in FIG. 1;

FIG. 3 is a cross-sectional view of an adjuster body of the light adjustment device shown in FIG. 1;

DETAILED DESCRIPTION OF THE PREFERRED EMBODIMENTS

The following detailed description is of the best presently contemplated modes of carrying out the invention. This description is not to be taken in a limiting sense, but is made merely for the purpose of illustrating general principles of embodiments of the invention. The scope of the invention is best defined by the appended claims.

Figure 1:
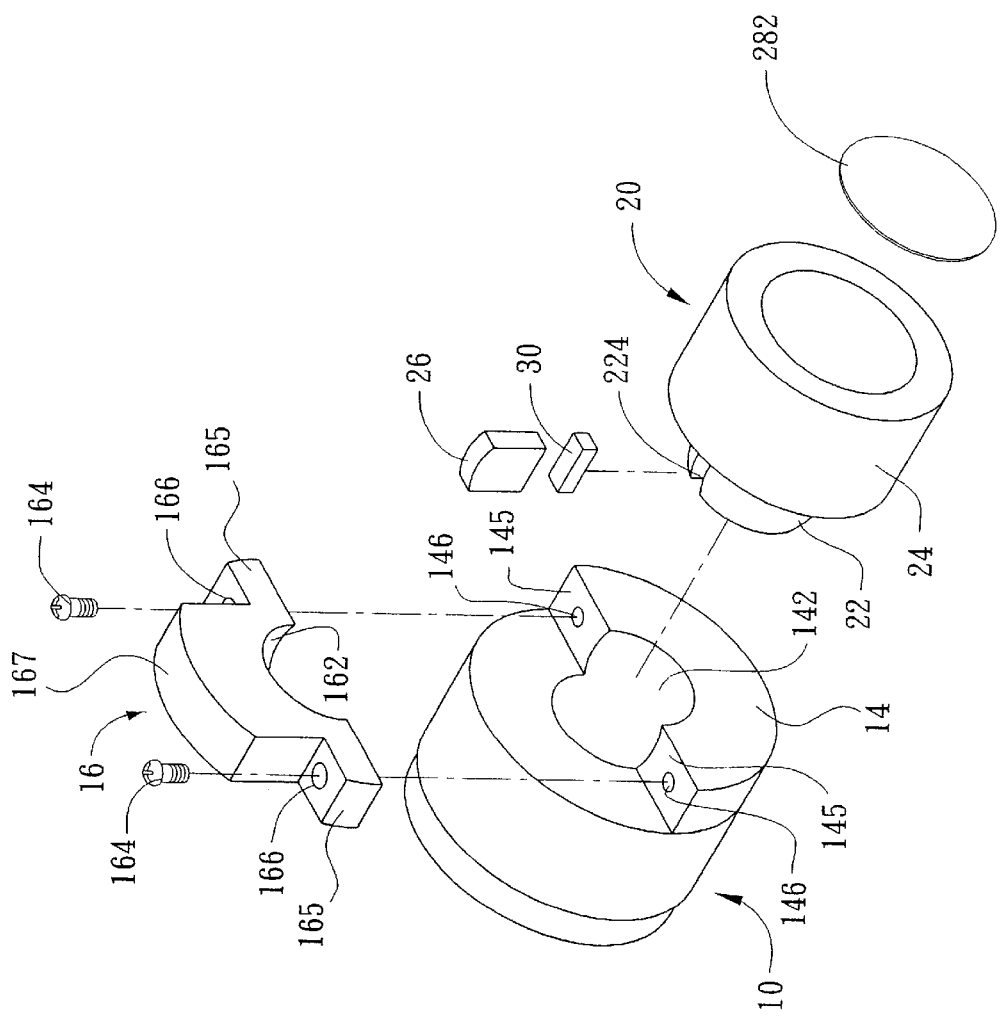
FIG. 1 is an exploded perspective view of a light adjustment device according to one embodiment of the present invention.

Referring to FIGS. 1–3, a light adjustment device for a laser resonant socket according to the present invention includes a laser base 10, a fixing upper cover 16, and an adjuster body 20. A laser chamber 12 is disposed inside the laser base 10 for a laser diode 40 to be secured therein. A fixing seat 14 is provided at a front end of the laser base 10, and is configured as a semi-circular segment having two sectional faces 145, each having a threaded hole 146, respectively. The inner surface of the fixing seat 14 is formed to be a semi-spherical groove 142.

The fixing upper cover 16 is also a semi-circular segment and is adapted to be connected to the fixing seat 14 of the laser base 10 to form a generally cylindrical construction. The upper cover 16 has two opposing outer flanges 165 extending from an arched central piece 167, with a fixing hole 166 provided at each outer flange 165. Each fixing hole 166 is aligned with a corresponding threaded hole 146 so that a threaded bolt 164 can be inserted through each fixing hole 166 and corresponding threaded hole 156 to secure the upper cover 16 to the fixing seat 14. A semi-spherical groove 162 is also formed at the inner circular surface of the arched central piece 167 so as to form a generally spherical fixing room 18 when the fixing upper cover 16 is combined with the fixing seat 14.

The adjuster body 20 has a resonant socket-fixing ball 22 and a generally cylindrical adjusting shaft 24. The resonant socket-fixing ball 22 is formed by cutting out two planar portions at two opposite sides of a sphere to form two generally planar and opposing sectional faces 228 and 229. A resonant socket room 222 is formed inside the ball 22, and is configured like a bore with an opening at each side thereof that is positioned at about the center of each sectional face 228, 229 of the ball 22. A laser resonant socket 30 is adapted to be retained inside the socket room 222. The adjusting shaft 24 is hollow, having one end connected to one sectional face 229 of the resonant socket-fixing ball 22, with the opening of the socket room 222 at the sectional face 229 defining a light exit 242 so that laser beams emitted from the resonant socket 30 can pass through the hollow interior of the adjuster shaft 24.

To assemble the present invention, the adjuster body 20 is provided with the laser resonant socket 30 therein, and the ball 22 is fitted inside the semi-spherical groove 142 of the fixing seat 14. The shaft 24 is then pivoted in any desired direction (i.e., up, down, left, right, rotate at any angle or extent) to adjust the relative position between the adjuster body 20 and the laser base 10 to achieve the highest output power position for the laser resonant socket 30. When the desired position has been found, the upper cover 16 can be secured to the fixing seat 14 by tightening the bolts 164.

In addition, a slot 224 may also be disposed in the resonant socket-fixing ball 22. The slot 224 can be cut from the outer surface of the ball 22 through to the resonant socket room 222 so as to make the installation of the laser resonant socket 30 easier. For the sake of filling in the cavity caused by the slot 224 and for strengthening and fixing the laser resonant socket 30, a resonant socket-fixing sheet 26 can be inserted into the slot 224 to tightly press and fix the laser resonant socket 30 so as to prevent the laser resonant socket 30 from receiving uneven heat expansion and output power drop owing to any deviation of the light point. In addition, because the resonant socket-fixing ball 22 is made of a metal material, it enjoys good heat conduction and can dissipate the heat generated from the laser resonant socket 30 to the outer surface of the ball 22 and then to the atmosphere. Moreover, the hollow interior of the adjusting shaft 24 can be used as a lens room 28 for installing a lens set 282 that functions to center any emitted laser beam.

Figure 4:
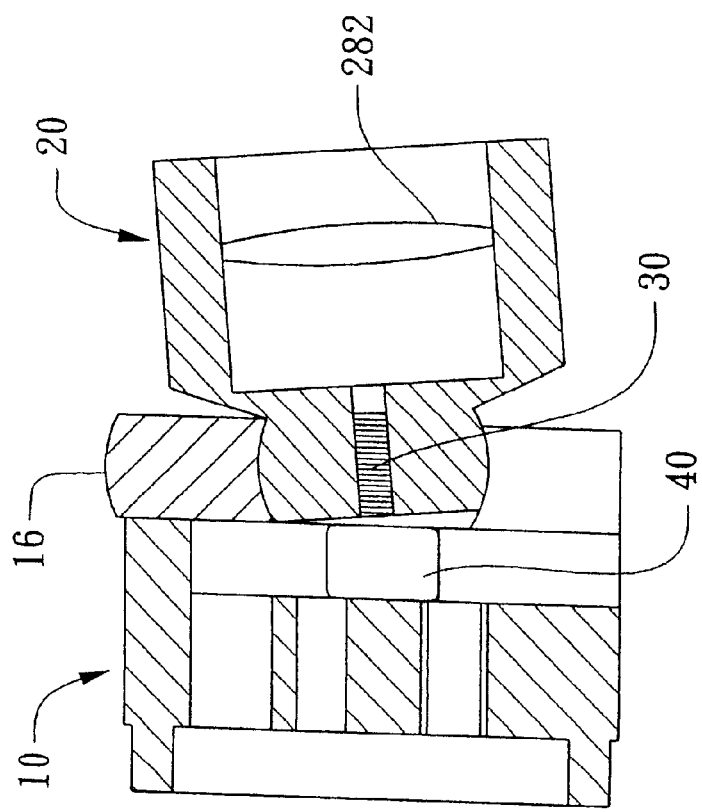
FIG. 4 is a cross-sectional view of the light adjustment device shown in FIG. 1, illustrating the operation of the entire device.

FIG. 4 is a cross-sectional view for illustrating the operation of a preferred embodiment of the present invention. When the adjuster body 20 having the laser resonant socket 30 therein is connected with the laser base 10, the user can adjust and rotate the adjuster body 20 to any angle or orientation to allow the relative position of the laser resonant socket 30 and the laser diode 40 to be such as to promote the optimum output power. The upper cover 16 can then be used to lock the adjuster body 20 tightly, and the laser beam can be adjusted to its center point for emission through the lens set 282 in the adjusting shaft 24.

As a result, the spherical structure of the resonant socket fixing ball 22 and the fixing function of a laser base 10 and an upper fixing cover 16 facilitate multi-directional adjustment, enabling the resonant socket 30 to obtain the highest output power possible.

FIGS. 5–8 illustrate another embodiment of a light adjustment device for a laser resonant socket according to the present invention. The embodiment of FIGS. 5–8 includes a laser base 340, a fixing upper cover 46, an adjuster body 50 and an oscillating cavity holder 56.

The laser base 340 can be the same as the laser base 10 described above, so that the elements 42, 44, 442 and 446 for the laser base 340 can be the same as the respective elements 12, 14, 142 and 146 for the laser base 10. Similarly, the fixing upper cover 46 can be the same as the fixing upper cover 16 described above, so that the elements 462, 464, 465, 466 and 467 for the fixing upper cover 46 can be the same as the respective elements 162, 164, 165, 166 and 167 for the fixing upper cover 16. The laser base 340 and fixing upper cover 46 operate in the same manner as the laser base 10 and fixing upper cover 16.

The adjuster body 50 is essentially the same as the adjuster body 20 described above, except that the slot 224 is omitted and the resonant socket room 222 is now provided in the form of a threaded through bore 525. Otherwise, the elements 52, 54, 58, 528 and 529 for the adjuster body 50 can be the same as the respective elements 22, 24, 28, 228 and 229 for the adjuster body 20. The ball 52 will be generally spherical (except for the sectional faces 528, 529) and there is no slot (such as 224). In addition, the resonant socket room 222 is now provided in the form of a threaded bore 525.

The oscillating cavity holder 56 is adapted to be threadably retained inside the threaded bore 525. The cavity holder 56 includes a shaft body 562 and a cavity cover 566. One end of the shaft body 562 has a generally L-shaped groove 564 that resembles a cut-out, and the opposite end of the shaft body 562 is provided with external threads 563 that are adapted to threadably engage the internal threads of the threaded bore 525. The inner side of the cavity cover 566 is also provided with an L-shaped groove 567 that resembles a cut-out. When the L-shaped grooves 564 and 567 are combined together, they form an oscillating chamber 568 that retains a laser-oscillating cavity 130. A light outlet 565 is provided at the opposing (threaded) end of the shaft body 562 to allow laser light to pass therethrough. Grooves 561 can be positioned on opposing sides of the threaded end of the shaft body 562 to allow the cavity holder 56 to be conveniently threaded into and out of the threaded bore 525.

As described above, the adjusting shaft 54 can be cylindrical with a hollow interior. The shaft 54 has one end connected to one sectional face 529 of the resonant socket-fixing ball 52, with the opening of the threaded bore 525 at the sectional face 529 defining a light exit so that laser beams emitted from the laser oscillating cavity 130 can pass through the hollow interior of the adjuster shaft 54.

To assemble the present invention, the laser oscillating cavity 130 is positioned inside the oscillating chamber 568, with the cavity cover 566 placed over the laser oscillating cavity 130. The cavity holder 56 is then threaded into the threaded bore 525 to secure the cavity holder 56 and the laser oscillating cavity 130 inside the ball 52. The ball 52 is fitted inside the semi-spherical groove 442 of the fixing seat 44. The shaft 54 is then pivoted in any desired direction (i.e., up, down, left, right, rotate at any angle or extent) to adjust the relative position between the adjuster body 50 and the laser base 340 to achieve the highest output power position for the laser oscillating cavity 130. When the desired position has been found, the upper cover 46 can be secured to the fixing seat 44 by tightening the bolts 464. The maximum power can also be adjusted by threading the cavity holder 56 further into or out of the threaded bore 525.

Thus, the oscillating chamber 568 of the oscillating cavity holder 56 is formed or defined by the two grooves 564 and 567. The oscillating cavity 130 can be pressed tightly and fixed by the upper cover 46 to prevent the oscillating cavity from non-uniform thermal expansion due to the emitted heat from the laser. In addition, because the resonant socket-fixing ball 52 and the oscillating cavity holder 56 are made of a metal material, they enjoy good heat conduction and can dissipate the heat generated from the laser oscillating cavity 130 to the outer surface of the ball 52 to be dissipated to the atmosphere. Moreover, the hollow interior of the adjusting shaft 54 can be used as a lens chamber 58 for installing a lens set 582 that functions to center any emitted laser beam.

Figure 5:
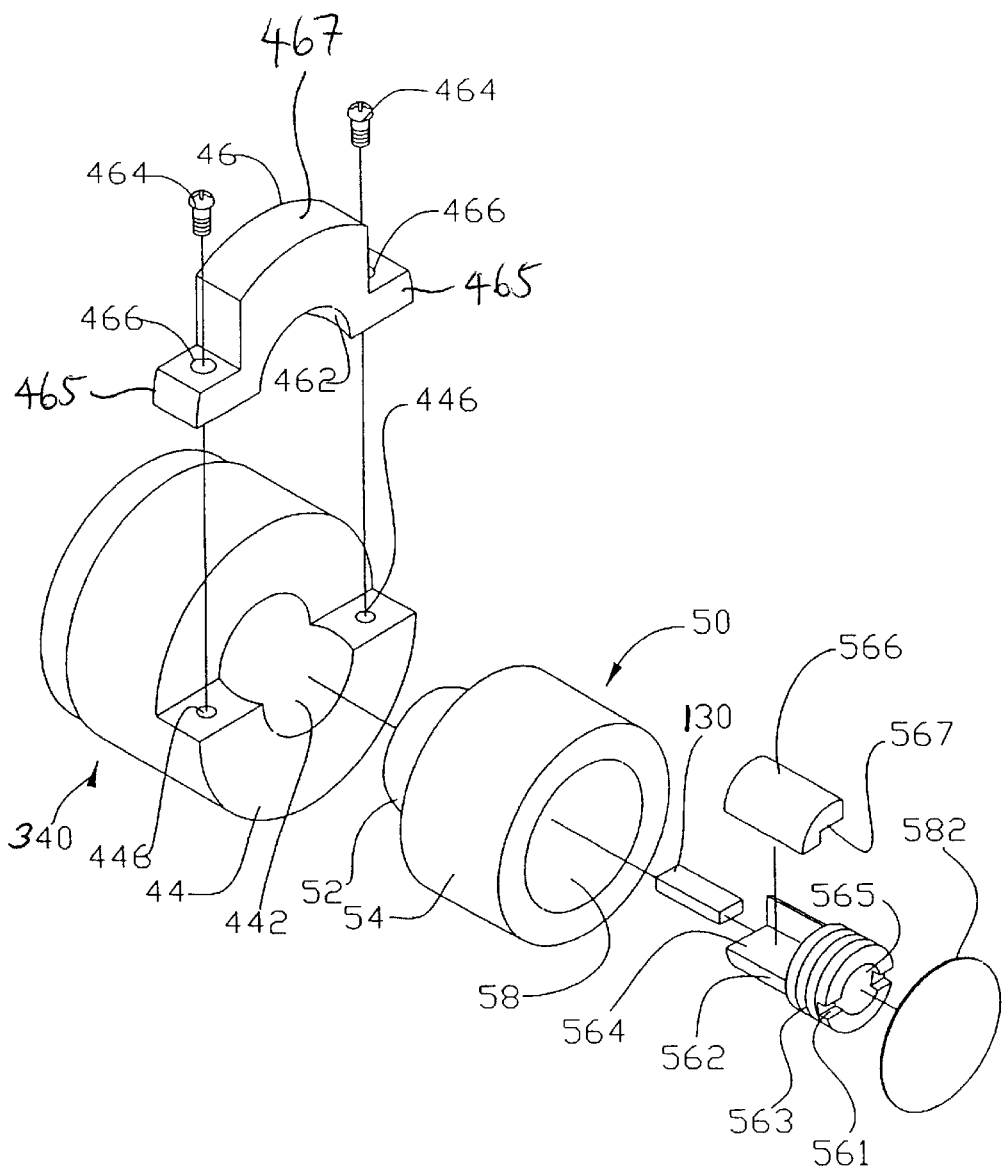
FIG. 5 is an exploded perspective view of a light adjustment device according to another embodiment of the present invention.
Figure 6:
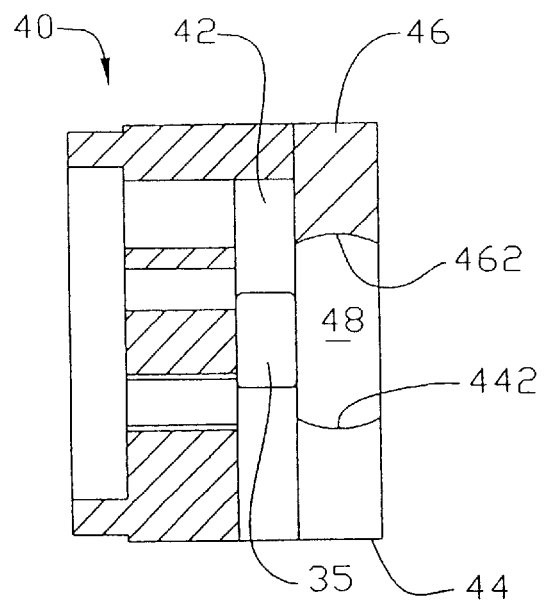
FIG. 6 is a cross-sectional view of a laser base of the light adjustment device shown in FIG. 5.
Figure 7:
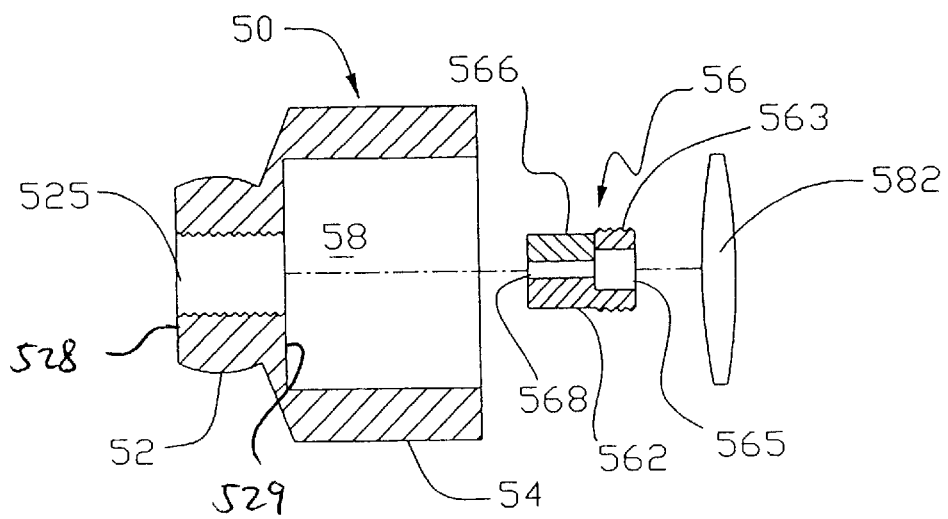
FIG. 7 is a cross-sectional view of an adjuster body of the light adjustment device shown in FIG. 5.
Figure 8:
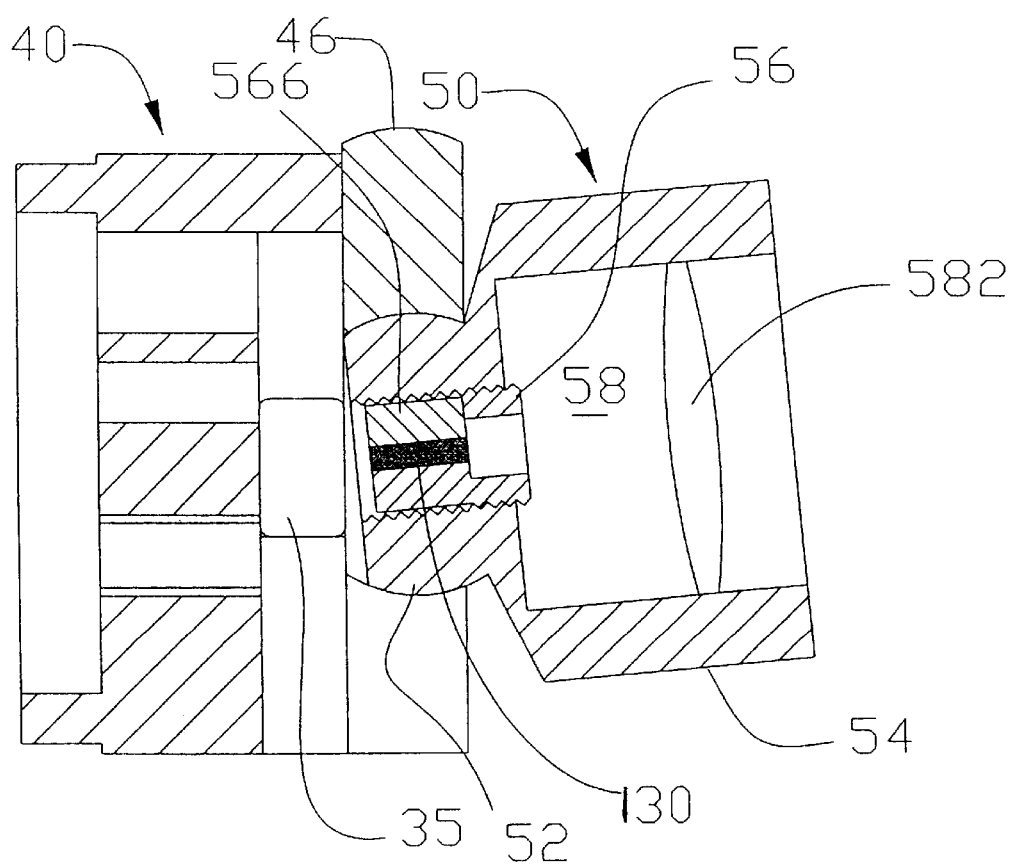
FIG. 8 is a cross-sectional view of the light adjustment device shown in FIG. 5, illustrating the operation of the entire device.

FIG. 8 is a cross-sectional view for illustrating the operation of the embodiment of FIGS. 5–7. When the adjuster body 50 having the laser oscillating cavity 130 therein is connected with the laser base 340, the user can adjust and rotate the adjuster body 50 to any angle or orientation to allow the relative position of the laser oscillating cavity 130 and the laser diode 35 to be such as to promote the optimum output power. The oscillating cavity holder 56 can be threaded further into or out of the threaded bore 525 so that the angles and positions of, and the distance between, the laser oscillating cavity 130 and the laser diode 35 are at an optimum relation. The upper cover 46 can be used to lock the adjuster body 50 tightly, and the laser beam can be adjusted to its center point for emission through the lens set 582 in the adjusting shaft 54.

Thus, the operational principles of the embodiment of FIGS. 5–8 accomplish the alignment and adjustment of the oscillating chamber by reciprocating (i.e., moving forward or backwards) the oscillating cavity holder 56 in a bore 525, and rotating a spherical surface on a ball 52 in a fixing seat 44. This allows the distance between the laser diode 35 and the laser oscillating cavity 130, the incident angles, and the matching of the polarization angles can be adjusted to optimize output power.

While the description above refers to particular embodiments of the present invention, it will be understood that many modifications may be made without departing from the spirit thereof. The accompanying claims are intended to cover such modifications as would fall within the true scope and spirit of the present invention.

What is claimed is:

1. A light adjustment device for a laser oscillating cavity, comprising:
    a laser base having a housing that defines a laser chamber that retains a laser diode therein, and a fixing seat disposed at one end of the housing;
    an upper cover that is removably coupled with the fixing seat to define a spherical groove;
    an adjuster body having a ball and an adjusting shaft, with a bore extending through the ball; and
    an oscillating cavity holder adjustably retained inside the bore.

2. The apparatus of claim 1, further including a laser-oscillating cavity retained inside the cavity holder.

3. The apparatus of claim 1, wherein the cavity holder includes:
    a shaft body having a groove; and
    a cavity cover that covers the groove to form an oscillating chamber.

4. The apparatus of claim 3, further including a laser-oscillating cavity retained inside the oscillating chamber.

5. The apparatus of claim 1, wherein the cavity holder has a light exit through which light from the laser diode can exit.

6. The apparatus of claim 1, wherein the bore is threaded.

7. The apparatus of claim 6, wherein the cavity holder has external threads that threadably engage the threaded bore to retain the cavity holder in the threaded bore.

8. The apparatus of claim 1, wherein the ball of the adjuster body is formed by cutting two opposing planar portions thereof, and has two openings, one opening at each of the planar portions of the ball for accessing the bore.

9. The apparatus of claim 8, wherein the adjusting shaft has a hollow section and is connected to one of the two planar portions so as to allow a laser beam emitted from the cavity holder to project through the hollow section thereof.

10. The apparatus of claim 9, further including a lens set positioned inside the hollow section of the adjuster shaft.

11. The apparatus of claim 1, wherein the upper cover is coupled to the fixing seat of the laser base by bolts.

12. The apparatus of claim 1, wherein the fixing seat of the laser base defines a semi-spherical groove.

13. The apparatus of claim 12, wherein the upper cover defines a semi-spherical groove.

14. A method of adjusting a laser oscillating cavity, comprising:
    providing a laser base having a housing that defines a laser chamber that retains a laser diode therein, and a fixing seat disposed at one end of the housing;
    providing an adjuster body having a ball and an adjusting shaft, the ball having a through bore;
    positioning a laser oscillating cavity holder into the bore;
    placing the ball on the fixing seat and pivoting the ball until a desired orientation is reached; and
    placing an upper cover over the ball and the fixing seat, and securing the upper cover to the fixing seat.

15. The method of claim 14, wherein the fixing seat defines a semi-spherical groove on which the ball is received and pivoted.

16. The method of claim 15, wherein the upper cover defines a semi-spherical groove which combines with the semi-spherical groove of the fixing seat to form the spherical groove.

17. The method of claim 14, further comprising:
    moving the cavity holder forward and backwards in the bore.

* * * * *